US011382221B2

(12) United States Patent
Mikawa

(10) Patent No.: US 11,382,221 B2
(45) Date of Patent: Jul. 5, 2022

(54) INFORMATION DISPLAY DEVICE

(71) Applicant: Akihisa Mikawa, Kanagawa (JP)

(72) Inventor: Akihisa Mikawa, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 4 days.

(21) Appl. No.: 17/099,930

(22) Filed: Nov. 17, 2020

(65) Prior Publication Data

US 2021/0153365 A1 May 20, 2021

(30) Foreign Application Priority Data

Nov. 19, 2019 (JP) .............................. JP2019-209078
Nov. 13, 2020 (JP) .............................. JP2020-189202

(51) Int. Cl.
*H05K 5/00* (2006.01)
*G06F 1/18* (2006.01)
*H01M 50/209* (2021.01)

(52) U.S. Cl.
CPC ........... *H05K 5/0017* (2013.01); *G06F 1/189* (2013.01); *H01M 50/209* (2021.01); *H05K 5/0086* (2013.01); *H01M 2220/30* (2013.01)

(58) Field of Classification Search
CPC ........... H01M 50/209; H01M 2220/30; H05K 5/0017; H05K 5/0086; G06F 1/189
See application file for complete search history.

(56) References Cited

U.S. PATENT DOCUMENTS

| 5,574,625 A * | 11/1996 | Ohgami ................ G06F 1/1626 312/223.2 |
| 5,608,612 A * | 3/1997 | Hokao ................... G06F 1/1626 429/97 |
| 6,829,495 B2 * | 12/2004 | Lee ...................... H04M 1/0262 455/575.1 |
| 9,874,900 B2 * | 1/2018 | Mehandjiysky ........ G06F 1/166 |
| 2004/0191614 A1 * | 9/2004 | Iwasaki ................. G06F 1/1626 429/96 |
| 2006/0077067 A1 * | 4/2006 | Chong .................. G06F 1/3203 340/815.4 |
| 2006/0079298 A1 * | 4/2006 | Saitoh .................. H04M 1/0262 455/575.1 |
| 2006/0119569 A1 * | 6/2006 | Tsai ...................... G06F 1/1632 345/156 |
| 2006/0220611 A1 * | 10/2006 | Choi .................... H01M 50/209 320/112 |
| 2007/0097614 A1 * | 5/2007 | Hsiao .................... G06F 1/1616 361/679.02 |
| 2010/0086840 A1 * | 4/2010 | Shao ................... H01M 50/209 429/97 |

(Continued)

FOREIGN PATENT DOCUMENTS

JP             4427838           3/2010

*Primary Examiner* — Hung S. Bui
*Assistant Examiner* — Sagar Shrestha
(74) *Attorney, Agent, or Firm* — IPUSA, PLLC

(57) ABSTRACT

An information display device includes an information display part which displays information on a screen, a battery for supplying power to the information display part, a device housing having a plurality of sides surrounding the screen, wherein the information display part being attached to the device housing, wherein the device housing includes a battery insertion portion, in which the battery is attached and detached in a direction along the screen at one side of the plurality of sides.

5 Claims, 13 Drawing Sheets

(56) References Cited

U.S. PATENT DOCUMENTS

| | | | |
|---|---|---|---|
| 2010/0119924 A1* | 5/2010 | Wang | H01M 50/209 |
| | | | 429/98 |
| 2011/0075381 A1* | 3/2011 | Chang | H01M 50/247 |
| | | | 361/747 |
| 2012/0026656 A1* | 2/2012 | Lee | H04B 1/3883 |
| | | | 361/679.01 |
| 2012/0039031 A1* | 2/2012 | Miyagi | H01M 50/20 |
| | | | 361/679.01 |
| 2012/0064384 A1* | 3/2012 | Cao | H01M 50/209 |
| | | | 429/100 |
| 2012/0092839 A1* | 4/2012 | Lai | H01M 50/209 |
| | | | 361/752 |
| 2013/0193758 A1* | 8/2013 | Liverance | H02J 7/0044 |
| | | | 307/48 |
| 2013/0209866 A1* | 8/2013 | Watanabe | H01M 50/209 |
| | | | 429/163 |
| 2018/0062689 A1* | 3/2018 | Xu | H04B 1/3888 |
| 2018/0166809 A1* | 6/2018 | Brogan | G06F 1/1658 |
| 2018/0351141 A1* | 12/2018 | Hayahi | H04M 1/0262 |
| 2020/0106868 A1* | 4/2020 | Balint | H01M 50/209 |
| 2021/0041926 A1* | 2/2021 | Park | H04B 1/3888 |

\* cited by examiner

INFORMATION DISPLAY DEVICE

CROSS-REFERENCE TO RELATED APPLICATIONS

The present application claims priority under 35 U.S.C. § 119 to Japanese Patent Application No. 2019-209078, filed Nov, 19, 2019 and Japanese Patent Application No. 2020-189202, filed Nov, 13, 2020, the contents of which are incorporated herein by reference in their entirety.

BACKGROUND OF THE INVENTION

Field of the Invention

The present invention relates to an information display device.

Description of the Related Art

An electronic apparatus drive by a battery is known in an electronic apparatus having a display device, such as a laptop computer and smartphone. For example, a laptop computer installed on a desk has a battery inserted on the back surface of the keyboard. The laptop computer may have a short operating time due to battery life. Thus, a battery replacement is to be done after a use of a predetermined time period. Because of the need to replace the battery, the laptop computer is structured to allow the user to replace the battery, Japanese Patent No. 4427838 discloses a structure for replacing the battery on the back surface of a liquid crystal display of the laptop computer.

SUMMARY OF THE INVENTION

If the battery is on the back of the keyboard, the laptop computer must be turned over when replacing the battery. As a result, the battery is not replaced in the laptop computer while the laptop computer is being installed. In addition, in a liquid crystal display disclosed in Japanese Patent No. 4427838, the battery is enclosed in an exterior cover. Therefore, it is necessary to remove the cover and replace the battery.

It is therefore difficult to replace the battery. It is an object of the present invention to provide an information display device which is capable of replacing the battery in an installed state.)

A disclosed technique includes an information display unit for displaying information on a screen, a battery for supplying a power to the information display unit, and a device housing having a plurality of sides that are mounted to the information display unit and enclose the screen, wherein the device housing includes a battery insertion portion in which the battery is detached from one side of the plurality of sides in a direction along the screen.

DESCRIPTION OF THE EMBODIMENTS

Figure 1:
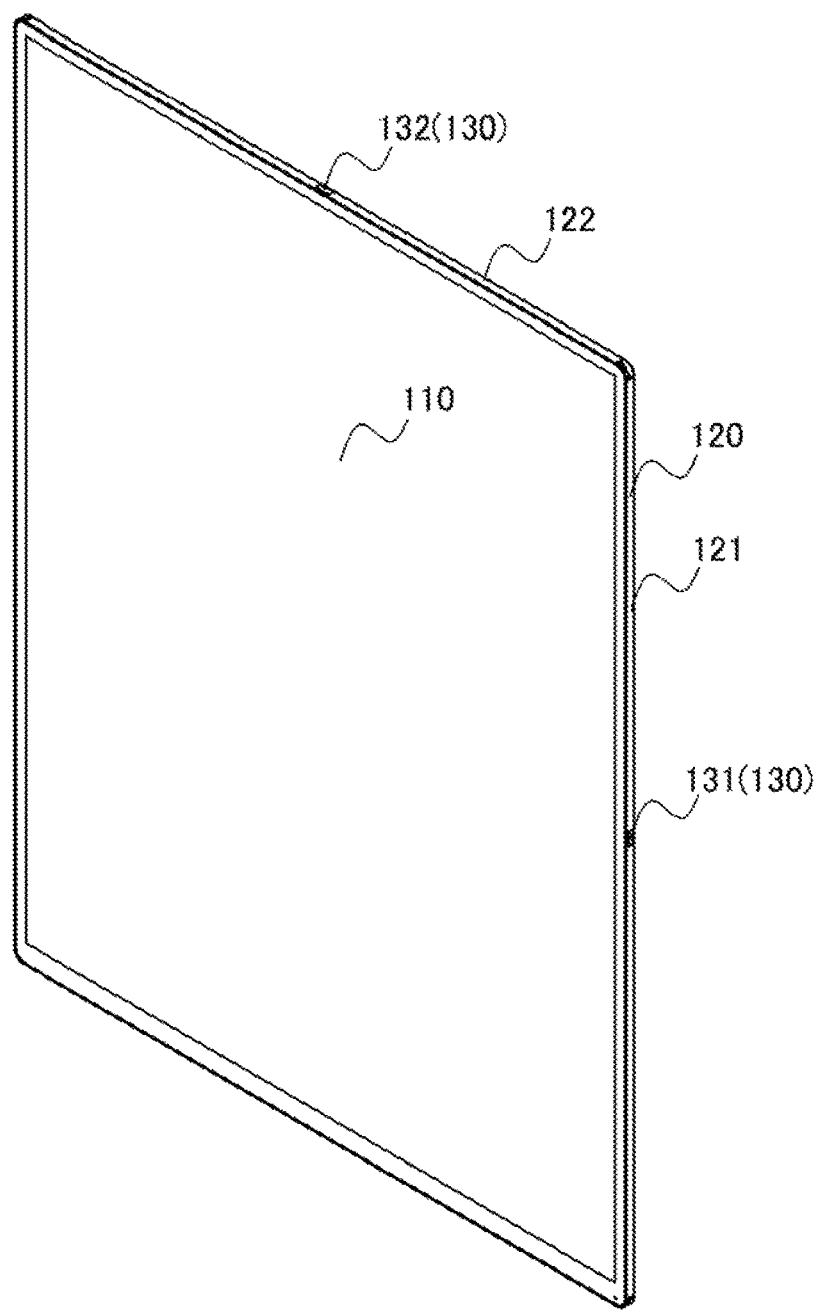
FIG. 1 is a perspective view of the information display device according to the present embodiment.
Figure 1:
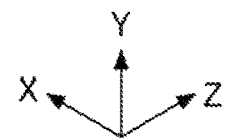

Hereinafter, an embodiment for carrying out the present invention will be described with reference to the drawings. In the present specification and the drawings, components having substantially the same functional structure is denoted by the same reference numerals, and the description thereof will not be repeated. Also, for ease of understanding, the reduction scale of each part in the drawings may differ from an actual reduction scale. Directions such as parallel, right-angled, orthogonal, horizontal, vertical, up and down, and left and right are allowed to deviate so as not to allow the effect of the embodiment. The shape of a corner is not limited to a right angle and may be rounded like an arch. Parallel, right-angled, orthogonal, horizontal, and vertical may include substantially parallel, substantially right-angled, substantially orthogonal, substantially horizontal, and substantially vertical.

<Information Display Device 100>

Figure 2:
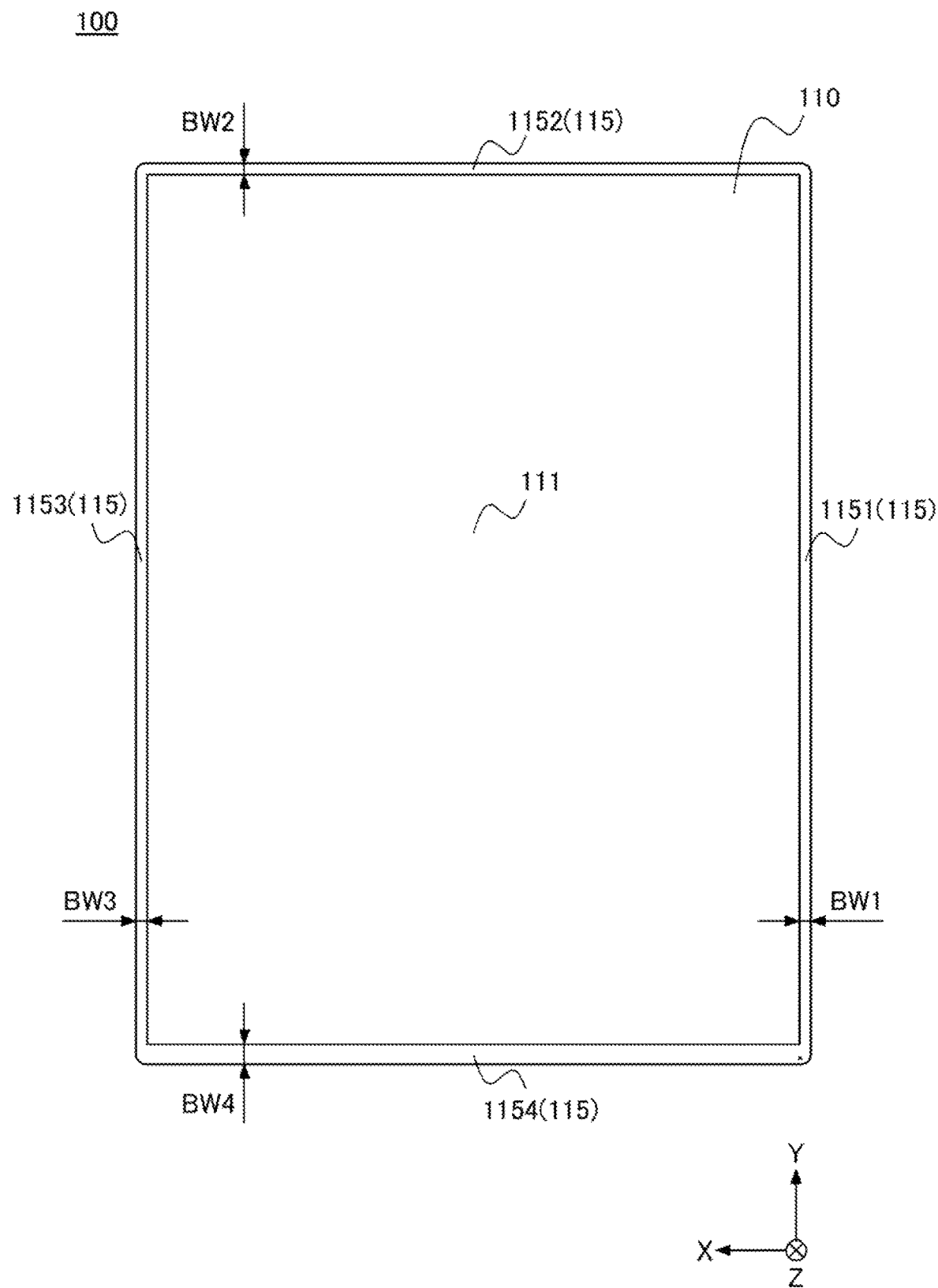
FIG. 2 is a front view of the information display device according to this embodiment.
Figure 3:
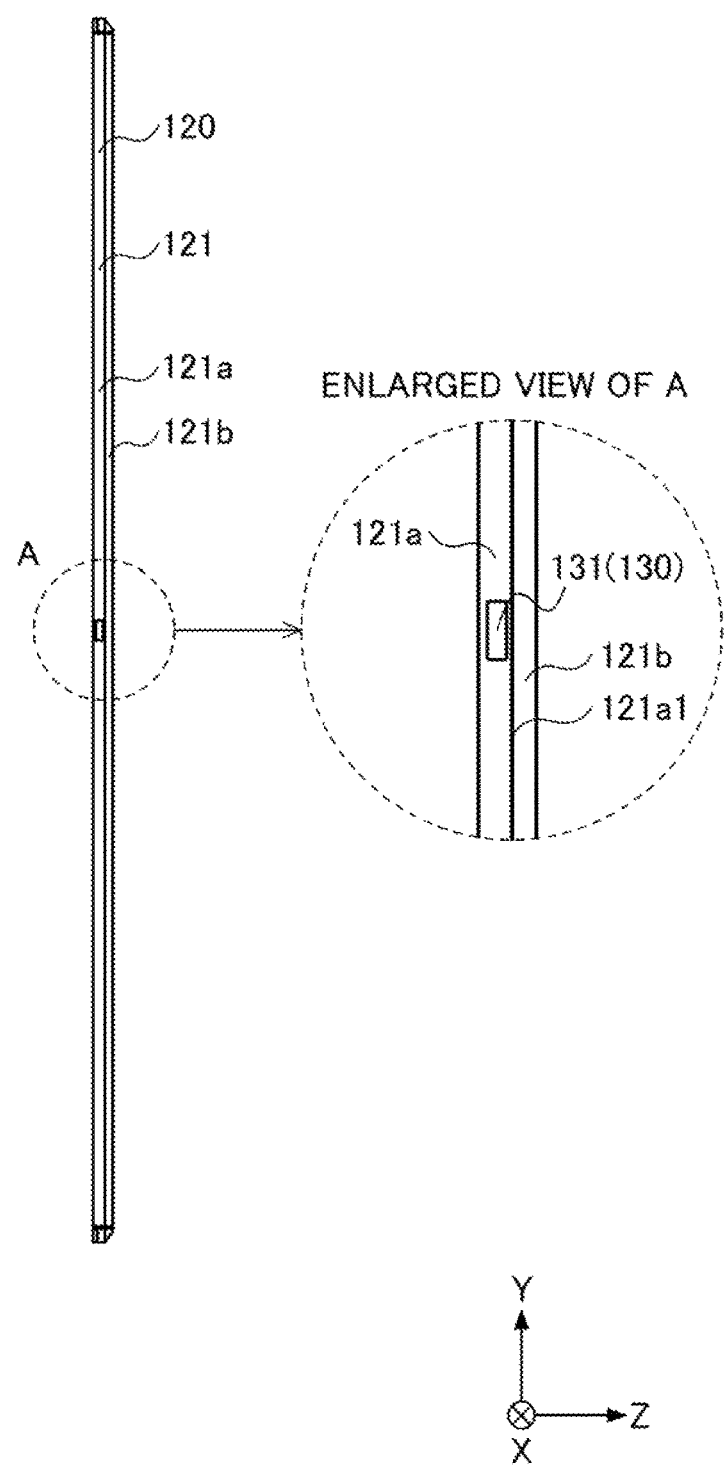
FIG. 3 is a right side view of the information display device according to the present embodiment.
Figure 4:
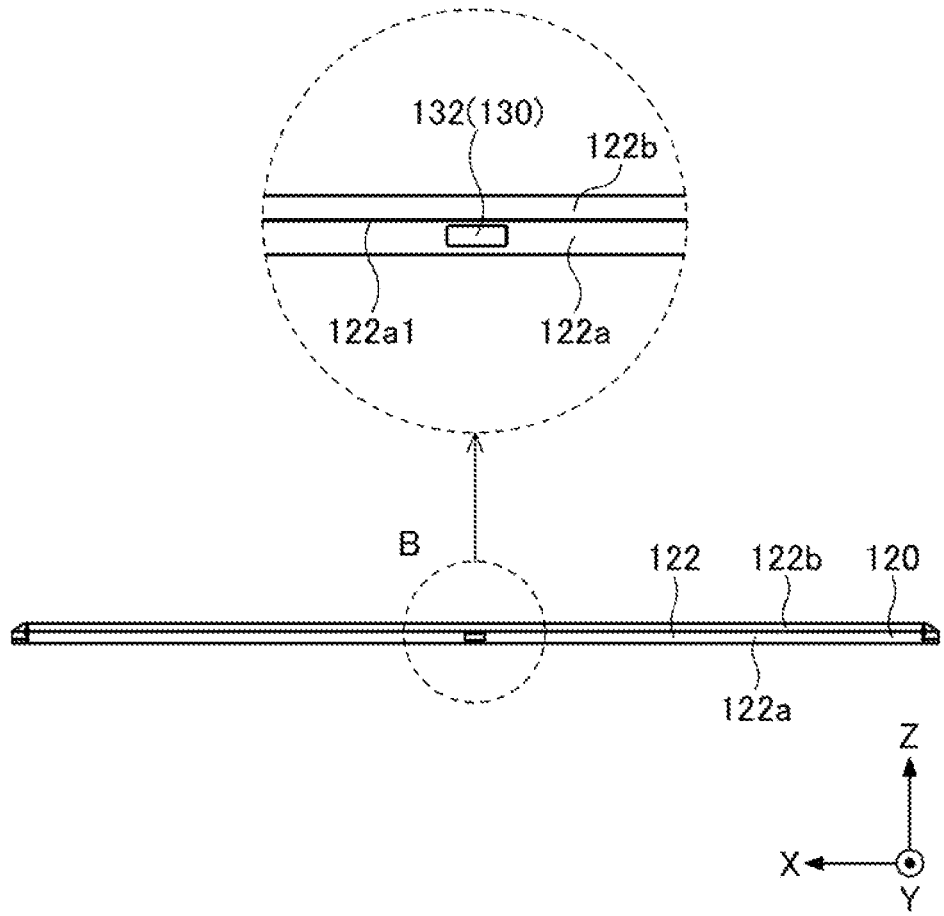
FIG. 4 is a top view of an information display device according to this embodiment.
Figure 5:
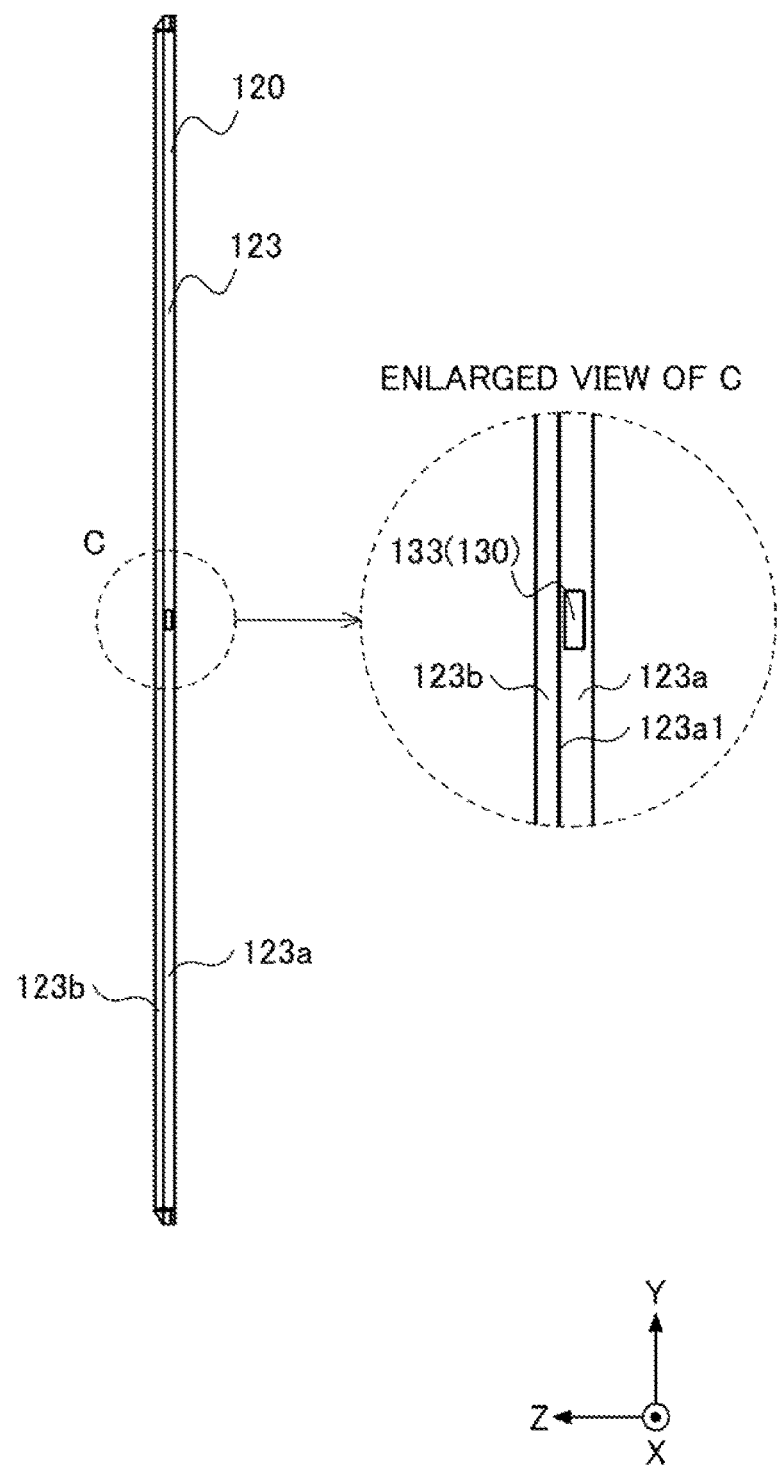
FIG. 5 is a left side view of the information display apparatus according to this embodiment.
Figure 6:
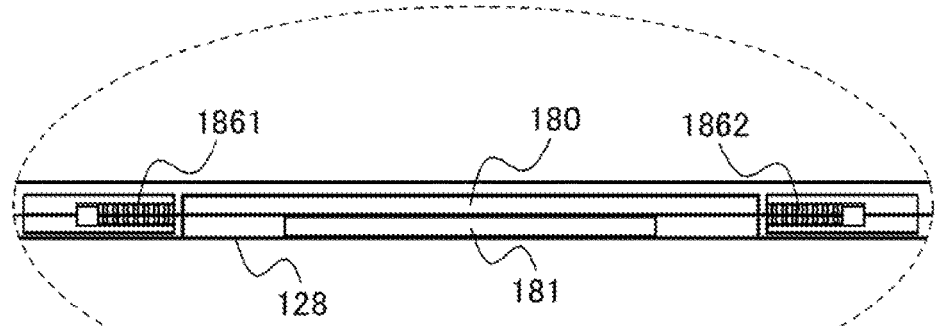
FIG. 6 is a bottom view of an information display device according to this embodiment.
Figure 6:
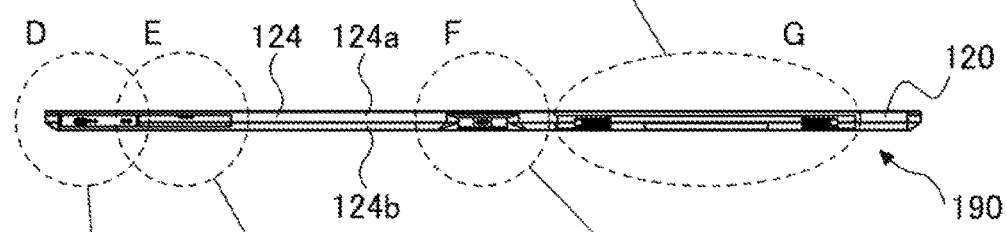
Figure 6:
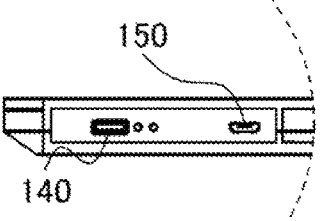
Figure 6:
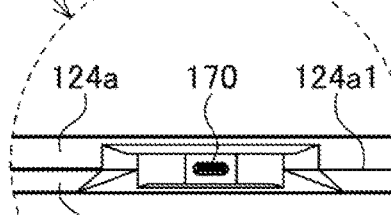
Figure 6:
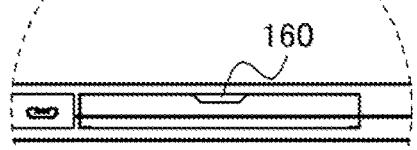
Figure 6:
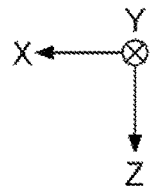
Figure 7:
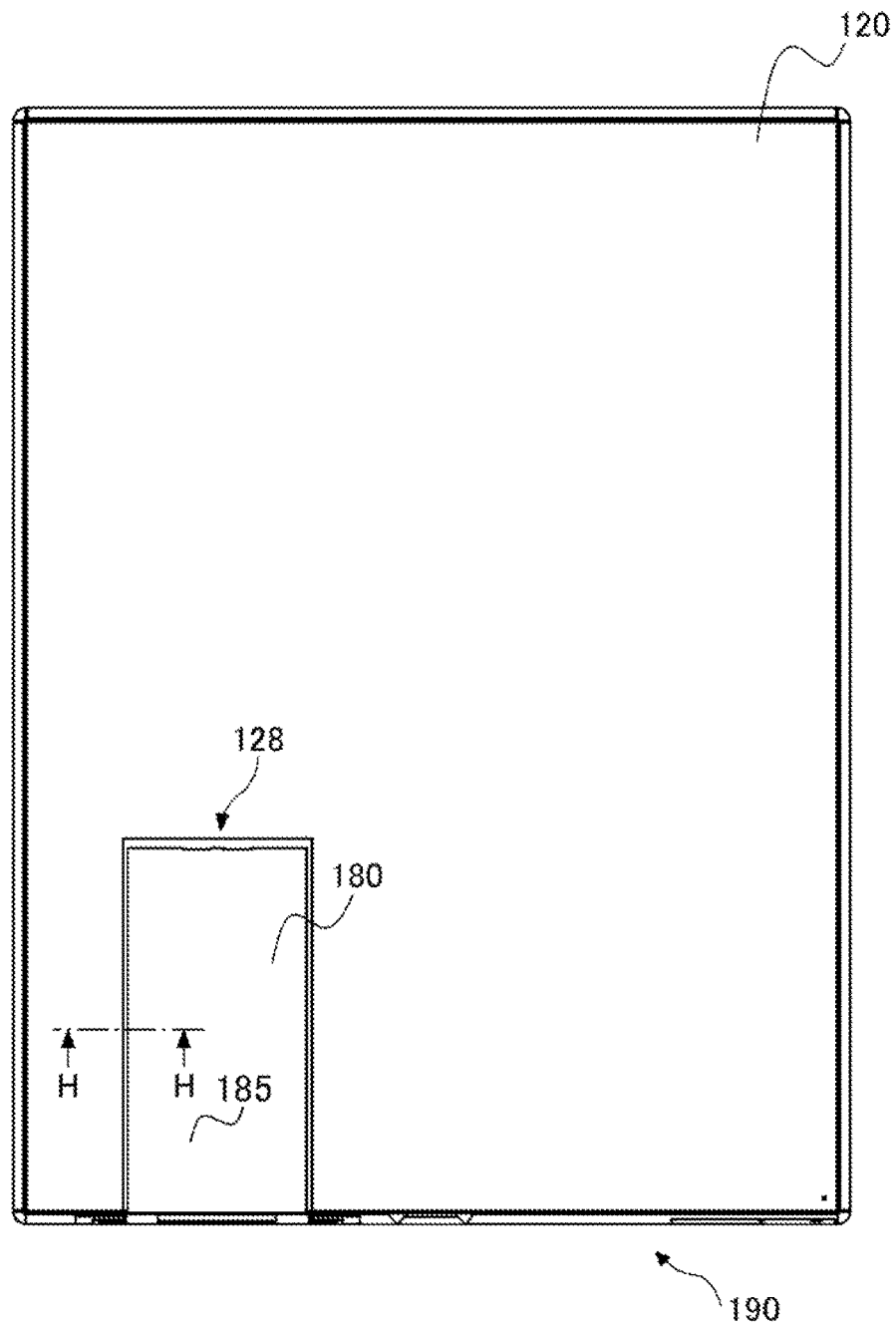
FIG. 7 is a back view of the information display apparatus according to the present embodiment.
Figure 8:
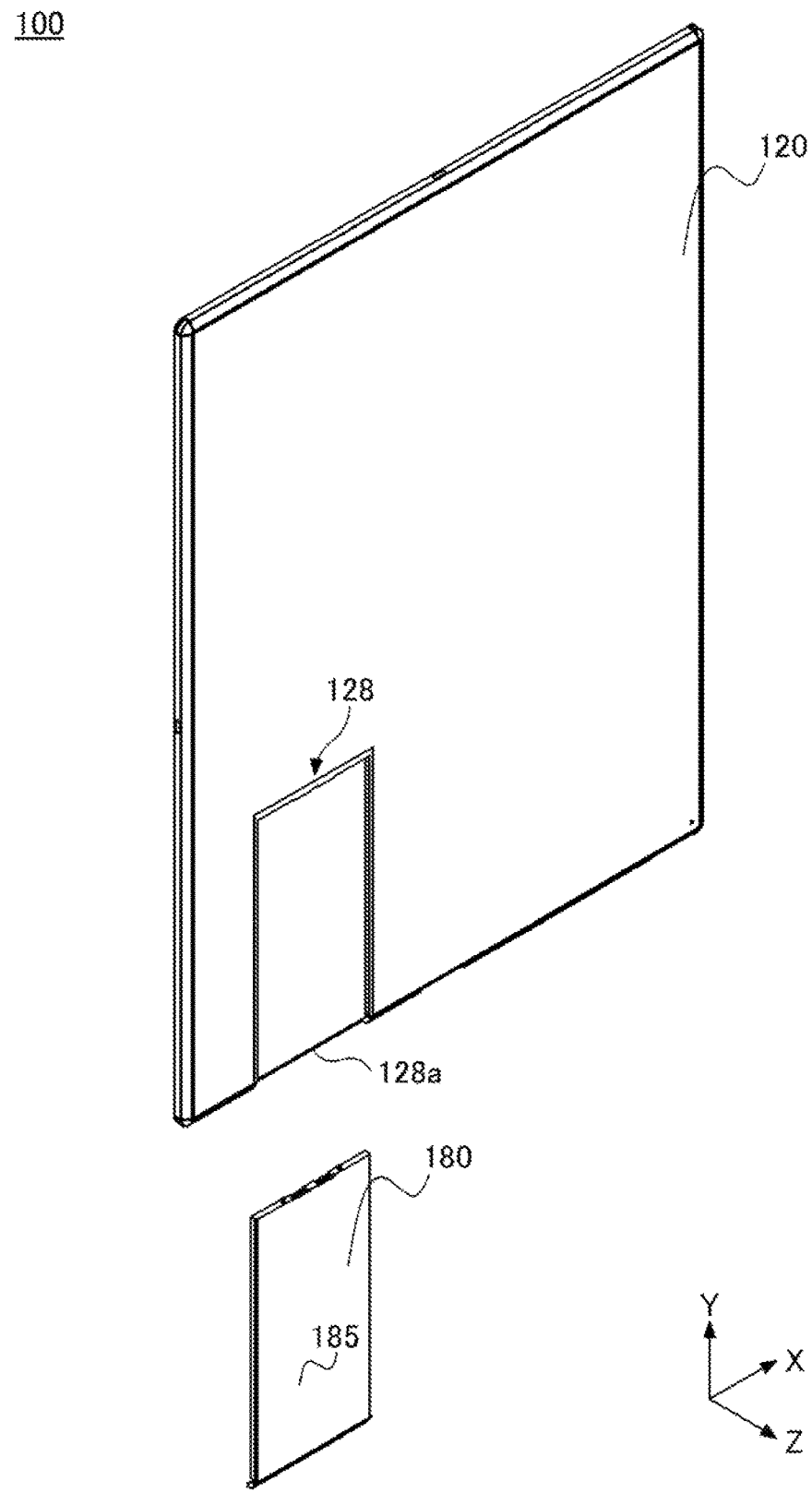
FIG. 8 is an exploded perspective view of the information display device according to the present embodiment.

FIG. 1 is a perspective view of the information display device 100 according to the present embodiment. FIG. 2 is a front view of the information display device 100 according to the present embodiment. FIG. 3 is a right side view of the information display device 100 according to the present embodiment. FIG. 4 is a top view of the information display device 100 according to the present embodiment. FIG. 5 is a left side view of the information display device 100 according to the present embodiment. FIG. 6 is a bottom view of the information display device 100 according to the present embodiment. FIG. 7 is a back view of the information display device 100 according to the present embodiment. FIG. 8 is an exploded perspective view of the information display device according to the present embodiment.

For the sake of explanatory convenience, a virtual three-dimensional coordinate system (XYZ orthogonal coordinate system) consisting of X, Y, and Z axes (XYZ axes) mutually orthogonal may be set. However, the coordinate system is provided for the purpose of explanation and does not limit the attitude of the information display device 100 or the like. In the present disclosure, unless otherwise explained, the X axis direction is a direction parallel to the screen 111 of the information display device 100 and is a short direction of the screen 111. The Y axis direction is a direction parallel to the screen 111 of the information display device 100 and is a longitudinal direction of the screen 111.

In other words, the XY plane parallel to the X axis direction and the Y axis direction is a plane parallel to the screen 111 of the information display device 100. The Z axis is in a direction perpendicular to the X axis and Y axis. In other words, the YZ plane parallel to the Y axis direction and the Z axis direction is a plane perpendicular to the screen 111 of the information display device 100. Similarly, the ZX plane parallel to the X axis direction and Z axis direction is a plane perpendicular to the screen 111 of the information display device 100.

In some cases, the X axis direction may be denoted the left-right directions, the Y axis direction is denoted top-bottom directions, and the Z axis direction is denoted a thickness direction. In addition, the +X side may be denoted a left side, −X side may be denoted a right side, +Y side may be denoted a top side, −Y side may be denoted a bottom side, and +Z side may be denoted a back side, and −Z side may be denoted a front side.

Meanwhile, viewing of the information display device 100 from the −Z side may be expressed as viewing from front. Further, viewing of the information display device 100 from the +Z side may be expressed as viewing from back. The information display device 100 includes an information display part 110 and a housing 120. The information display device 100 displays a screen, such as a PC (Personal Computer). Further, by using a dedicated pen-type input device, characters or graphics can be written freely on the information display part 110. Further, one feature of the information display device 100 according to the present embodiment is that the thickness is thin as illustrated in FIGS. 1 to 6. The information display device 100 of this embodiment is designed thin and lightly to produce a portable display product even when a large inch number of displays is used.

Another feature of the information display device 100 according to the present embodiment is that the back surface is completely flat, as illustrated in FIGS. 3 to 6. Therefore, for example, the information display device 100 can be positioned flat on a desk, and the information display device 100 can be surrounded by a plurality of persons for a discussion. Further, the information display device 100 can correspond to inputs made by a plurality of pen-type input devices so that the information display device 100 can be written by a plurality of persons at the same time. Further, both the main body of the information display device 100 and the pen-type input device are dustproof and waterproof so that the information display device 100 can be used outdoors.

[Information Display Part 110]

The information display part 110 is a device for displaying information on the screen. The information display part 110 is a so-called flat panel display, such as an electronic paper, a liquid crystal display, or an organic EL (Electroluminescence) display. The information display part 110 includes a screen 111 that is formed by pixels and performs display and a frame portion 115 positioned at the periphery of the screen. A screen 111 is parallel to the XY plane of the XYZ orthogonal coordinate system.

The frame portion 115 forms a so-called screen frame, i.e., a bezel. Display is not done in the frame portion 115. In the front view of FIG. 2, the frame portion 115 includes a right side frame portion 1151, a top side frame portion 1152, a left side frame portion 1153, and a bottom side frame portion 1154 on the right side of the screen 111. The width of each frame portion (bezel width), that is, the width from the border of each frame portion and the border of the screen 111 to the outside of each frame portion will be described.

The bezel widths of the right frame portion 1151, the top side frame portion 1152, and the left side frame portion 1153 are the same width as each other. That is, the bezel width BW1 of the right side frame portion 1151, the bezel width BW2 of the top side frame portion 1152, and the bezel width BW3 of the left side frame portion 1153 are equal to each other. The bezel width of the bottom side frame portion 1154 is wider than the bezel width of the right side frame portion 1151, the top side frame portion 1152, and the left side frame portion 1153. That is, the bezel width of the bottom side frame portion 1154 is the widest of the frame portion. In other words, the bezel width BW4 of the bottom side frame portion 1154 is larger than the bezel width BW1 of the right side frame portion 1151, the bezel width BW2 of the top side frame portion 1152, and the bezel width BW3 of the left side frame portion 1153. This makes it easier to recognize the direction of the information display device 100 when viewed from the front. Incidentally, in the description of the present disclosure, each element of the information display device 100 is specified by using the right side, the left side, the top side, the bottom side, or the like from the front side, but these are for the purpose of explanation and not limiting the attitude of the information display device 100. For example, the information display device 100 may be installed in a horizontal plane, or the information display device 100 may be installed such that the bottom side frame portion 1154 is on the top, left, or right side. The same applies to the following description.

[Housing 120]

The shape of the housing 120 is substantially a rectangle. The information display part 110 is installed on the front side of the housing 120. The housing 120 holds the information display part 110 and a circuit or the like for driving the information display part 110. The housing 120 has the right side surface 121, top side surface 122, left side surface 123, and bottom side surface 124 relative to the front side.

That is, the right side surface 121, the top side surface 122, the left side surface 123, and the bottom side surface 124 are a plurality of side surfaces surrounding the screen 111 of the information display part 110. In other words, the housing 120 includes a plurality of sides surrounding the screen 111. The right side surface 121 is positioned on the right side of the screen 111. The right side surface 121 has a vertical side surface 121a perpendicular to the screen 111 and a sloped side surface 121b inclined relative to the direction perpendicular to the screen 111. The vertical side surface 121a is a plane parallel to the YZ plane. The sloped side surface 121b is a plane that is inclined from the sloped side surface 121b of the vertical side surface 121a to the left, the direction of which is determined when viewed from the front, with respect to the YZ plane. The top side surface 122 is positioned above the screen 111. The top side surface 122 has a vertical side surface 122a perpendicular to the screen 111 and a sloped side surface 122b inclined relative to the screen 111. The vertical side surface 122a is a plane parallel to the ZX plane. The sloped side surface 122b is a plane that inclines downwardly from the back surface side end 122a1 of the vertical side surface 122a relative to the ZX plane.

The left side surface 123 is positioned on the left side of the screen 111. The left side surface 123 has a vertical side surface 123a perpendicular to the screen 111 and the sloped side surface 123b inclined relative to the vertical direction of the screen 111. The vertical side surface 123a is a plane parallel to the YZ plane. The sloped side surface 123b is a plane that is inclined to the right side from the back surface side end 123a1 of the vertical side surface 123a from the front relative to the YZ plane. The bottom side surface 124 is located below the screen 111. The bottom side surface 124 has a vertical side surface 124a perpendicular to the screen 111 and the sloped side surface 124b inclined relative to the vertical direction of the screen 111.

The vertical side surface 124a is a plane parallel to the ZX plane. The sloped side surface 124b is a plane that inclines upwardly with respect to the ZX plane from the back end 124a1 of the vertical side surface 124a. The information display device 100 according to the present embodiment includes a plurality of infrared sensors for transmitting and receiving information with the neighboring information display device 100. The right side surface 121 of the housing 120 has an infrared sensor window 131 on the vertical side surface 121a. The top side surface 122 has an infrared sensor window 132 on the vertical side surface 122a. The left side surface 123 has an infrared sensor window 133 on the vertical side surface 123a. The infrared sensor transmits and receives infrared signals through the infrared sensor windows 131, 132 and 133. The infrared sensor windows 131, 132, and 133 are collectively referred to as an infrared sensor window 130.

The housing 120 includes a power button 140, a communication connector 150, a card connector cover 160, and a power source connector 170 on the bottom side surface 124. The power button 140 is operated by a user when a power on/off operation of the information display device 100 is performed. The power button 140 is a member that is touched by the user when the user turns the information display device 100 on and off. The power button 140 is an example of an operation unit that is operated by the user when the operation of the information display device 100 is performed. The information display device 100 according to the present embodiment includes at least a power button 140 in an operation unit. The operation unit may include a button for operating the information display device 100 in addition to the power button 140. For example, an operation unit may include a menu button for displaying a menu on the screen, a cursor movement button for selecting a menu, a confirmation button, or the like.

The communication connector 150 is a data communication unit that connects an external device such as a PC or a USB (Universal Serial Bus) flash memory to communicate data. Inside a card connector cover 160, there is a connector that connects a card such as an SD (Secure Digital) card and SIM (Subscriber Identity Module) card.

A power source cable is inserted into the power source connector 170. The power source connector 170 is externally connected to the power source connector. The power source connector 170 is supplied from the outside. The power source connector 170 constitutes a power source connecting portion. The power button 140, the communication connector 150, the connector inside the card connector cover 160, and the power source connector 170 may be collectively referred to as the interface portion 190.

The housing 120 also includes a battery inlet 128a (see FIG. 8) at the bottom side surface 124 to which the battery 180 is inserted. FIG. 8 is an exploded perspective view of the information display device 100 according to the present embodiment. Specifically, this is a diagram illustrating a state in which the battery 180 is removed from the information display device 100.

The information display device 100 according to the present embodiment also operates using a battery drive. The battery 180 is configured to be detachable rather than built-in.

The battery 180 is removable from bottom side surface 124. The battery insertion portion 128 is formed on the back of the housing 120. As illustrated in FIG. 8, the battery insertion portion 128 is formed outside the housing 120. The battery 180 includes a battery housing 185 in a rectangular shape. The battery housing 185 includes a secondary battery constituting the battery 180 and a circuit board for supplying and discharging the secondary battery.

As illustrated in FIG. 7, the battery housing 185 of the battery 180 is exposed from the housing 120 on the side (outer surface 185a (see FIG. 12)) opposite the screen 111. The housing 120 includes a battery locking portion 1861, 1862 on the bottom side surface 124 for locking the battery 180 out of the battery insertion portion 128.

The battery locking portions 1861, 1862 are connected with engaging claws which engage the battery 180. In normal use, the engaging claw and battery 180 are engaged to prevent the battery 180 from disconnecting. Also, when the battery locking portions 1861 and 1862 are slid outward relative to the battery 180, the engaging nail is disengaged from the battery 180. The engaging claw is disengaged from battery 180 to unlock battery 180 and allow battery 180 to be removed. The information display device 100 according to the present embodiment can switch locking/unlocking by sliding the battery locking portions 1861 and 1862 in the X axis direction.

The battery 180 is provided with a battery handle 181. The user pulls the battery handle 181 downwardly to remove the battery 180.

The information display device 100 of this embodiment has an interface portion 190 and a battery insertion portion 128 on the bottom side surface 124 of the housing 120 adjacent the bottom side frame portion 1154 that is wide with respect to the other frame portion 115.

The interface portion 190 is operated by a user in using the information display device 100.

At the battery inlet 128a, the battery 180 is detached by the user. The bottom side surface 124 of the housing 120 adjacent the bottom side frame portion 1154 which is wide relative to the other frame portion 115 has aggregated portions where manipulation and operation are performed by the user.

The housing 120 is an example of a device housing. Next, the housing 120 will be described in further detail.

Figure 9:
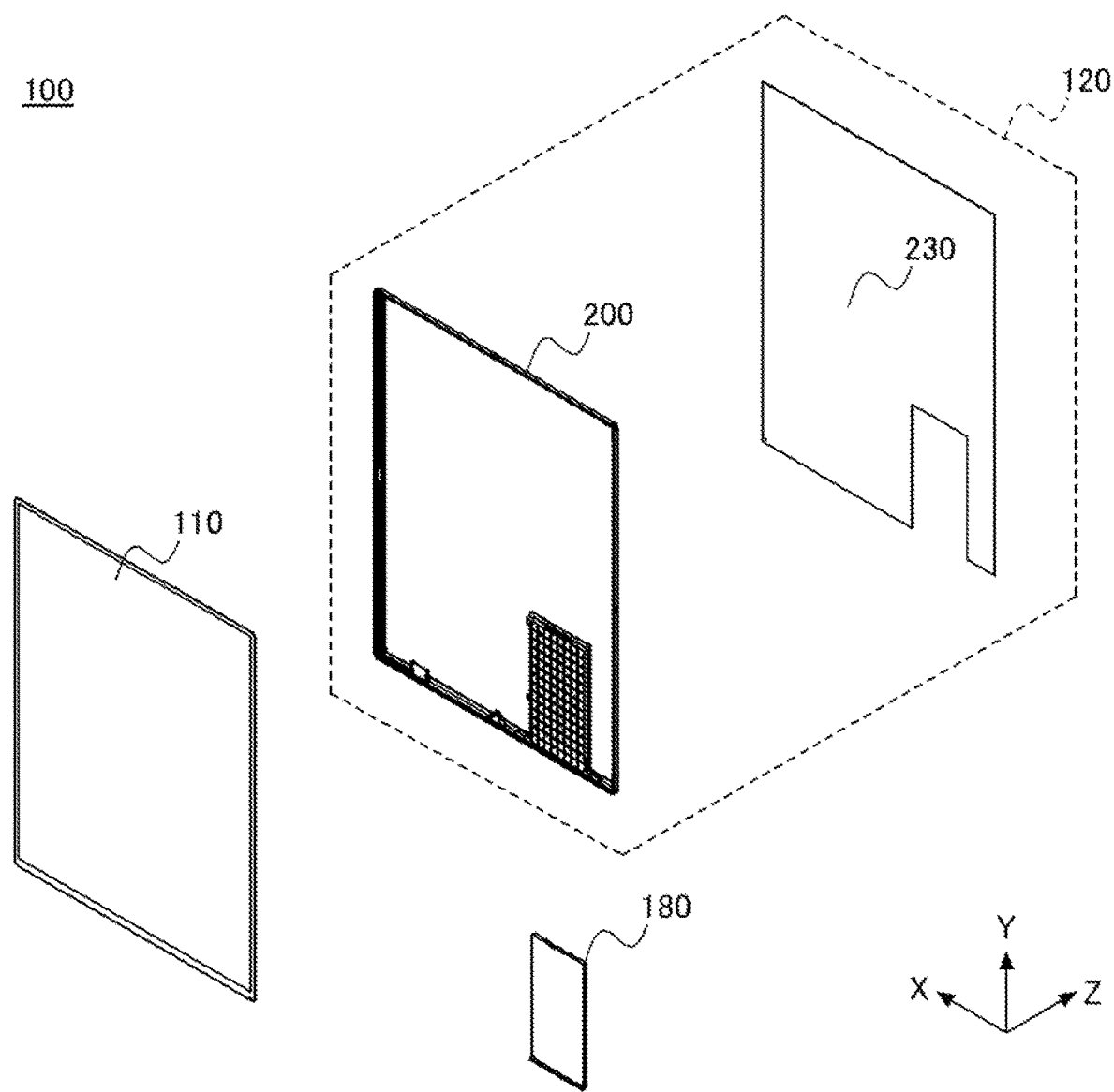
FIG. 9 is an exploded perspective view of the information display device according to the present embodiment.

FIG. 9 is an exploded perspective view of the information display device 100 according to the present embodiment. The housing 120 of the information display device 100 includes a housing frame 200 and a back plate 230. An information display part 110 is mounted on the front side of the housing frame 200. A back plate 230 is attached to the backside of the housing frame 200. The housing 120 is configured by mounting the back plate 230 to the housing frame 200. The insertion and removal of the battery 180 will now be described.

Figure 10:
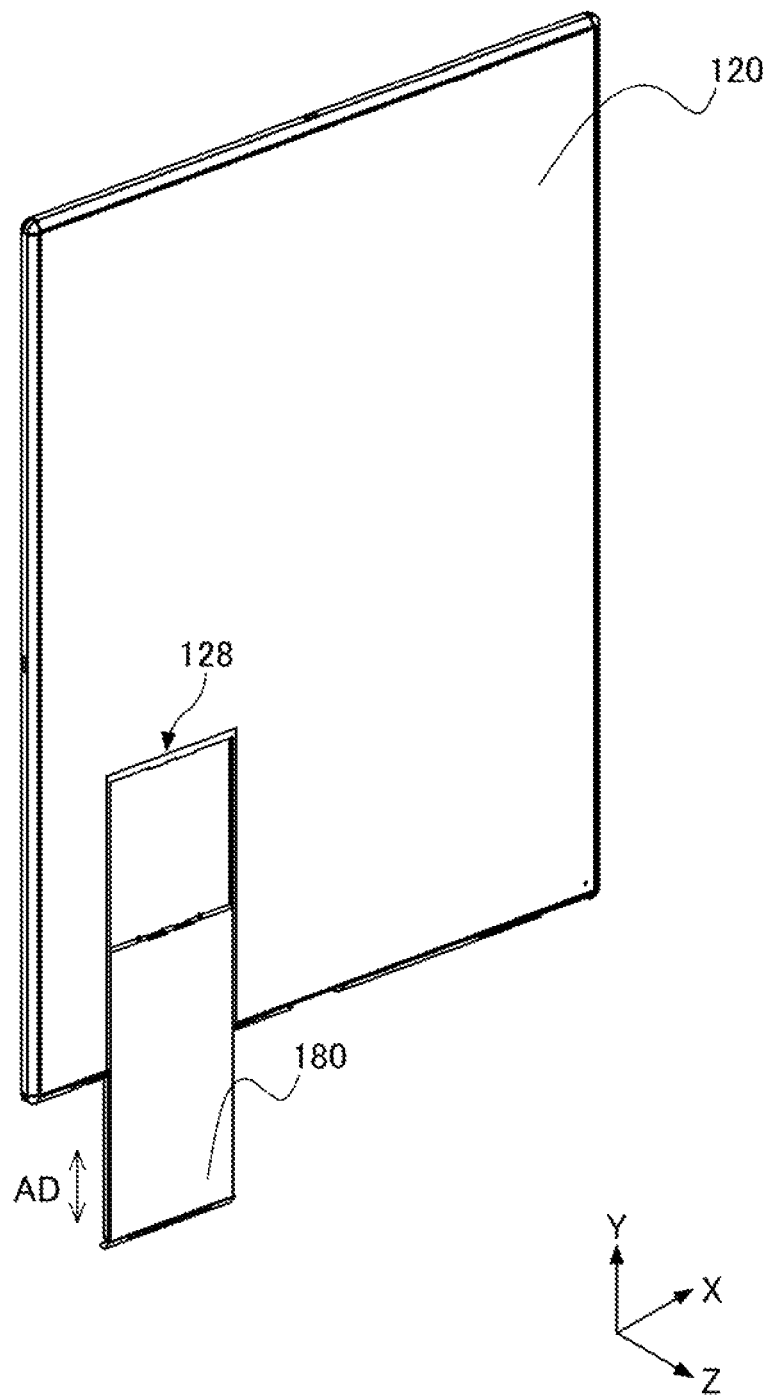
FIG. 10 is a diagram illustrating a process of inserting and removing a battery of an informa0ce according to this embodiment.
Figure 11:
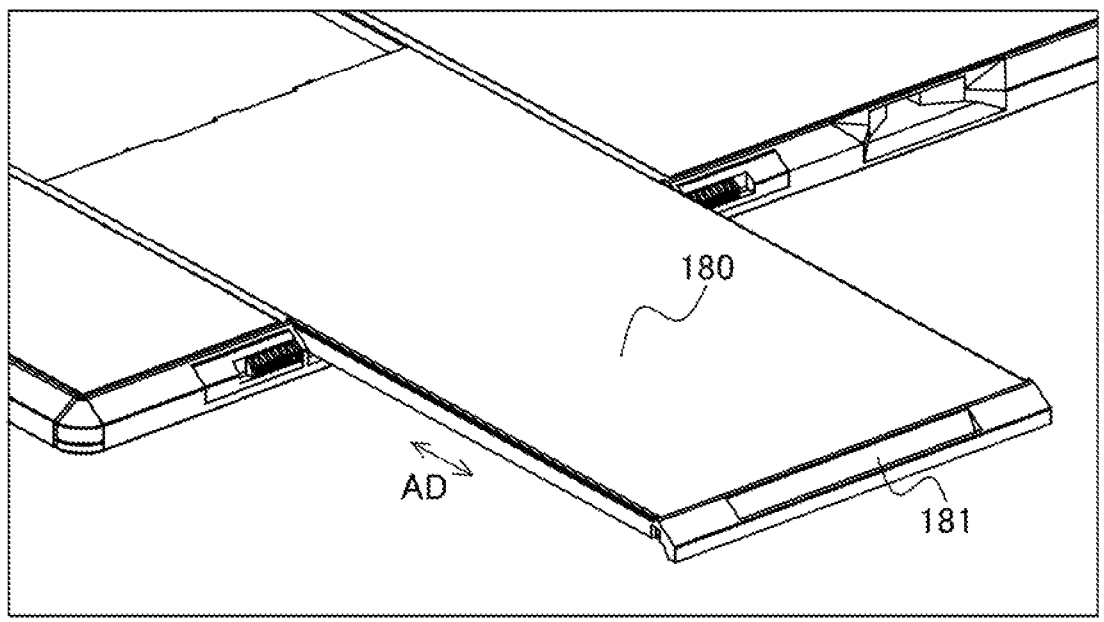
FIG. 11 is a diagram illustrating a process of inserting and removing a battery in the information display device according to this embodiment.
Figure 12:
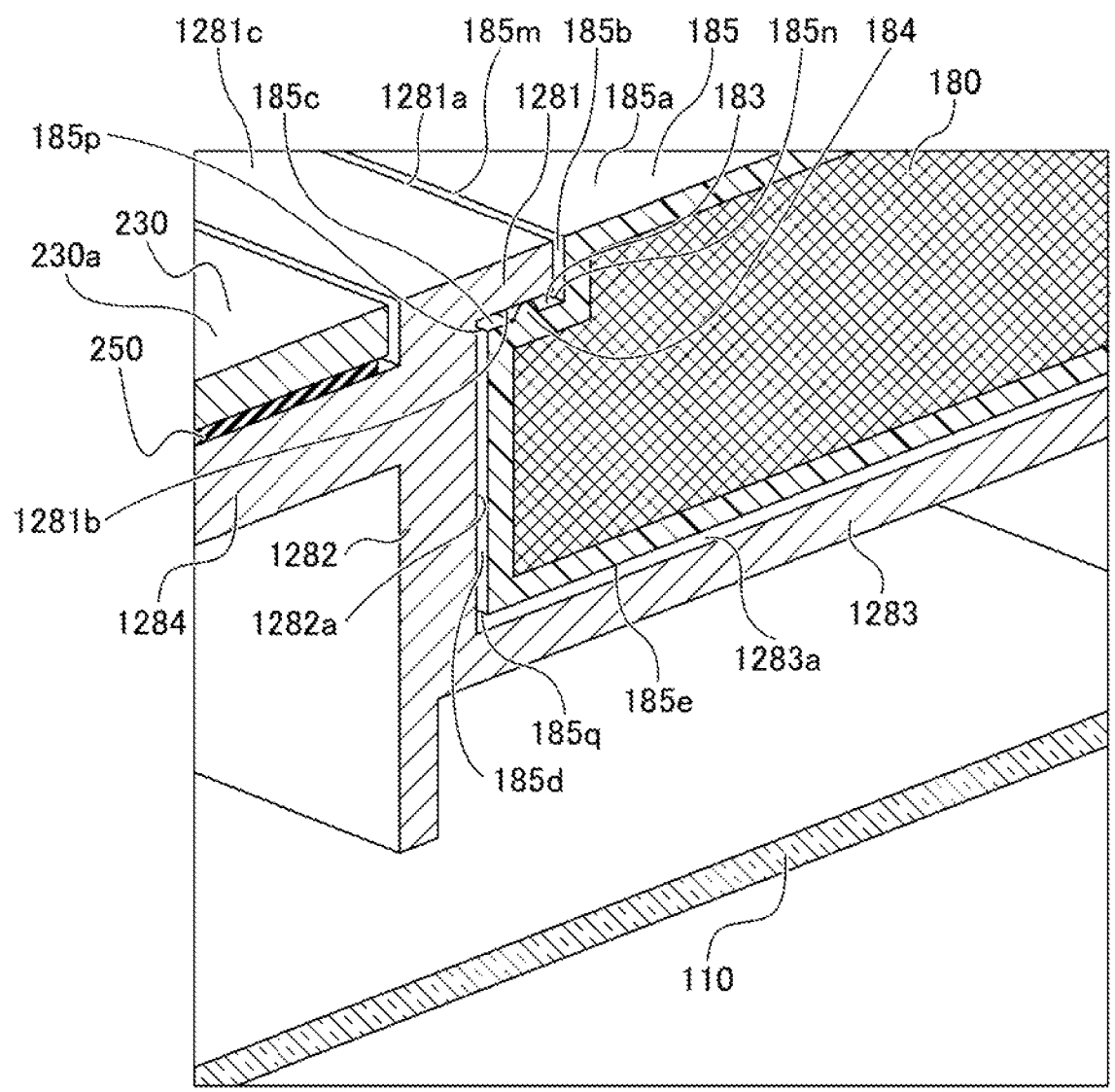
FIG. 12 is a cross-sectional perspective view of a portion of the information display device according to the present embodiment.
Figure 12:
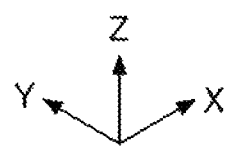

FIGS. 10 and 11 are diagrams illustrating the process of inserting and removing the battery 180 of the information display device 100 according to the present embodiment. The battery 180 is inserted and extracted in the direction of the arrow AD illustrated in FIGS. 10 and 11, that is, in the Y axis direction, with respect to the information display device 100. The battery 180 and battery insertion portion 128 will be described in detail. FIG. 12 is a cross-sectional perspective view of a portion of the information display device 100 according to the present embodiment. Specifically, FIG. 12 is a perspective view of a cross-section cut along with H-H in FIG. 7. In FIG. 12, the internal structure of the secondary battery and the circuit board of the battery 180 is omitted. As illustrated in FIGS. 10 and 11, the battery 180 is attached and detached by sliding the battery 180 in a direction along the screen of the information display part 110, more specifically in the Y axis direction. As illustrated in FIG. 12, the battery insertion portion 128 includes an outer wall portion 1281, a side wall portion 1282, and an inner wall portion 1283.

The side wall portion 1282 is a plate-like member extending in a direction perpendicular to the screen 111 of the information display part 110, that is, in the Z axis direction. Although FIG. 12 illustrates the left side wall portion 1282 viewed from the back surface side relative to the battery 180, the side wall portion 1282 is formed on the surface along the battery insertion portion 128 when the battery 180 is inserted into the battery insertion portion 128 (see FIG. 7). Specifically, the side wall portion 1282 is provided on the left, top, and right sides, the direction of which is determined when viewed from the back, relative to the battery 180. The outer wall portion 1281 is located on the back surface side of the side wall portion 1282.

The outer wall portion 1281 extends from the side wall portion 1282 in a direction parallel to the screen 111. The inner wall portion 1283 is positioned in a front side of the side wall portion 1282. The inner wall portion 1283 extends from the side wall portion 1282 in a direction parallel to the screen 111. The battery housing 185 has an outer surface 185a on the back side, a first step surface 185b and a second step surface 185c and a side 185d on the left side, the direction of which is determined when viewed from the back, and an inner surface 185e on the front side. The outer surface 185a is a plane parallel to the XY plane. The first step surface 185b is a surface extending in a front direction from the left side end side 185m, the direction of which is determined when viewed from the back of the outer surface 185a. The first step surface 185b is a plane parallel to the YZ plane.

The second step surface 185c is a surface extending in the left direction, the direction of which is determined when viewed from the back, from the front side end side 185n of the first step surface 185b. The second step surface 185c is a plane parallel to the XY plane. The second step surface 185c differs in height in the Z axis direction from the outer surface 185a. The second step surface 185c is positioned closer to the screen 111 than the outer surface 185a. The side 185d is a surface extending in the front direction from left side end side, the direction of which is determined when viewed from the back of the second step surface 185c. The side 185d is a plane parallel to the YZ plane. The inner surface 185e extends from the front side end side 185q of the side 185d in the right direction, the direction of which is determined when viewed from the back. The inner surface 185e is a plane parallel to the XY plane.

The battery 180 has the stage 183 formed with the first step surface 185b and the second step surface 185c on the front side relative to the outer surface 185a. The stage 183 is positioned between the outer wall portion 1281 and the inner wall portion 1283 when the battery 180 is inserted into the battery insertion portion 128. The battery housing 185 has a stage similar to the above stage on the right side, the direction of which is determined when viewed from the back. When the battery 180 is inserted into the battery insertion portion 128, the first step surface 185b of the stage 183 faces the right end surface 1281a, the direction of which is determined when viewed from the back of the outer wall portion 1281. When the battery 180 is inserted into the battery insertion portion 128, the second step surface 185c of the stage 183 and the inner surface 1281b of the front of the outer wall portion 1281 face each other. The outer wall portion 1281, the side wall portion 1282, and the inner wall portion 1283 are positioned to surround the battery housing 185 of the battery 180. For example, when the battery 180 is inserted into the battery insertion portion 128, the side 185d of the battery housing 185 faces the right side surface 1282a, the direction of which is determined when viewed from the back side of the side wall portion 1282.

When the battery 180 is inserted into the battery insertion portion 128, the inner surface 185e of the battery housing 185 and the back side surface 1283a of the inner wall portion 1283 face each other. The outer wall portion 1281, the side wall portion 1282, and the inner wall portion 1283 surround the stage 183 of the battery 180 to prevent the battery 180 from moving in a direction that crosses the screen 111 and guide the insertion of the battery 180. Further, the outer wall portion 1281 prevents the battery 180 from being attached or detached in the direction perpendicular to the screen 111 of the information display part 110, i.e., the Z axis direction. Therefore, the battery can only be attached or detached by sliding in the direction of arrow AD illustrated in FIGS. 10 and 11. The outer wall portion 1281 is an example of a wall portion that prevents the battery from being attached or detached in the direction perpendicular to the screen 111 of the information display part 110, that is, from being attached or detached in the Z axis direction.

The battery housing 185 has a projecting portion 184 extending in the Y axis direction from the back side of the second step surface 185c of the stage 183. The projecting portion 184 is semi-circular in cross-section in the Y axis direction. A sliding resistance can be reduced when the battery 180 is inserted into the battery insertion portion 128 using the projecting portion 184. By reducing the sliding resistance when the projecting portion 184 contacts the outer wall portion 1281, the user can attach and detach the battery 180 with light force. The information display device 100 according to this embodiment can insert and extract the battery 180 in the direction of the arrow AD without changing the installation attitude of the information display device 100. The battery insertion portion 128 has a back plate mount portion 1284 on the left side, the direction of which is determined when viewed from the back of the side wall portion 1282 for mounting the back plate 230. The back plate 230 is attached to the back plate mount portion 1284 through the double-sided tape 250.

As illustrated in FIG. 9, the back plate 230 is notched at a portion facing the battery insertion portion 128. That is, in the information display device 100 of this embodiment, the battery insertion portion 128 is not covered with the back plate 230. Thus, the battery insertion portion 128 is not inside the housing 120 but outside the housing 120. When the information display device 100 according to the present embodiment is used outdoor, it is necessary to perform dust-proof and waterproof. For example, if the battery is stored inside the housing and the user fails to close the lid of the battery accommodating portion, water may easily enter the inside of the housing and adversely affect the operation of the product.

Meanwhile, in the information display device 100 according to the present embodiment, the battery insertion portion 128 is outside the housing 120. In the information display device 100 of this embodiment, the battery 180 is assembled to the outside of the housing 120. The assembly of the battery 180 outside of the housing 120 prevents water from entering the interior of the housing 120 when the battery 180 is inserted or removed. The battery 180 according to this embodiment has a waterproof structure.

Figure 13:
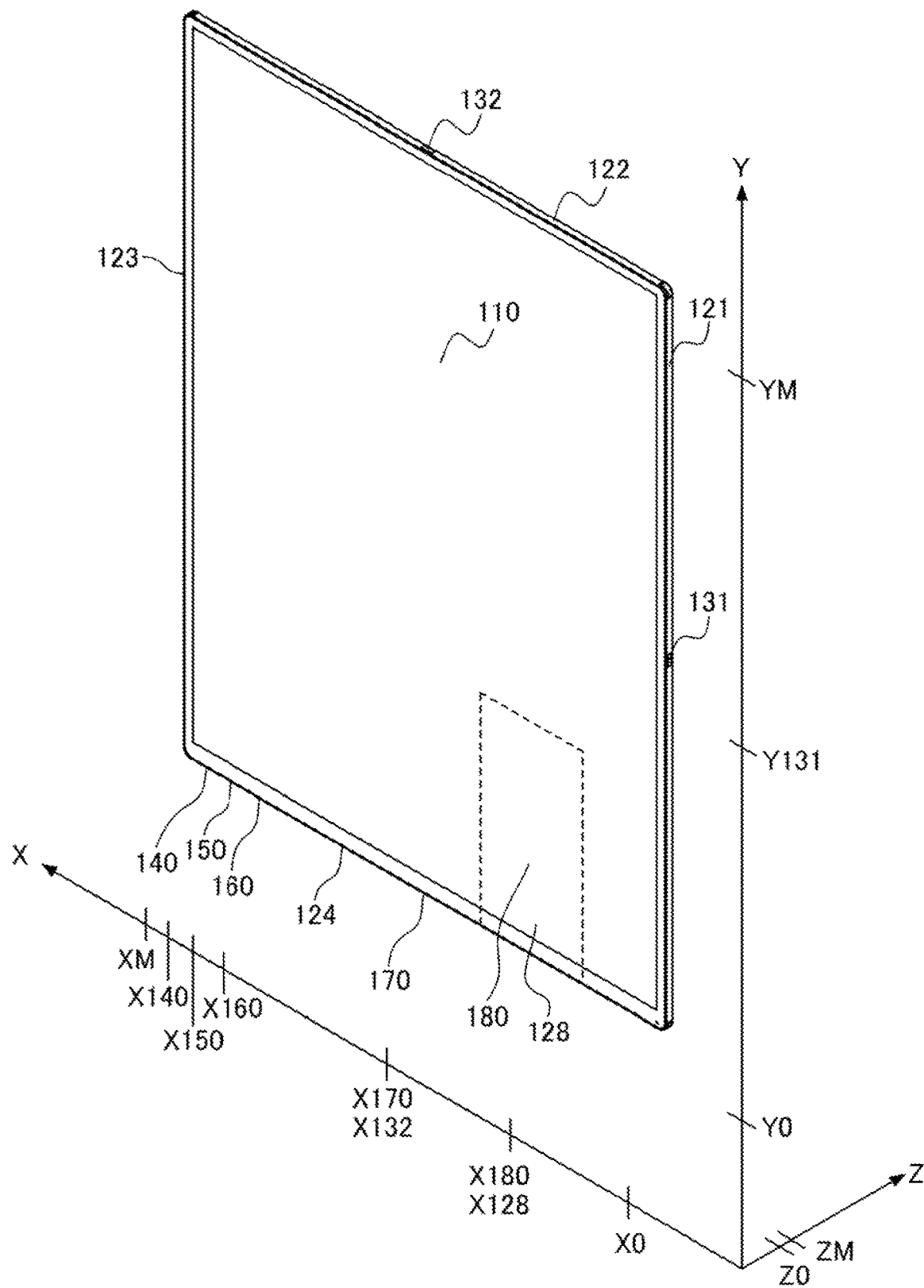
FIG. 13 is a perspective view of the information display device according to the present embodiment.

FIG. 13 is a perspective view of the information display device 100 according to the present embodiment. Specifically, FIG. 13 is a diagram illustrating the coordinates when the information display device 100 is disposed in a virtual three-dimensional coordinate space. For example, the information display device 100 according to this embodiment is disposed in a range of the virtual three-dimensional coordinates X0 to XM, Y0 to YM, and Z0 to ZM. The right side surface 121 is provided at X0. The top side surface 122 is provided on the YM and is parallel to the ZX plane. The left side surface 123 is provided on the XM and is parallel to the YZ plane. The bottom side is provided at Y0 and parallel to the ZX plane. The screen 111 of the information display part 110 is parallel to the XY plane in Z0. A power button 140 is provided on X140. A communication connector is provided in X150. A card connector cover 160 is provided on X160.

A power source connector 170 is provided in X170. The center of the battery 180 in the X axis direction is provided in X180. The center of the X axis direction of the battery insertion portion 128 is provided at X128. The infrared sensor window 132 is also provided in X132. An infrared sensor window 131 is provided at Y131. In FIG. 12, the outer surface 185a of the battery housing 185, the back side surface 1281c of the outer wall portion 1281, and the back side surface 230a of the back plate 230 are substantially coplanar in the Z axis direction. That is, when the information display device 100 according to this embodiment is disposed in a range of the virtual three-dimensional coordinates X0 to XM, Y0 to YM, and Z0 to ZM, the Z axis component of the outer surface 185a of the battery housing 185 is equal to ZM. The Z axis component of the surface 158c is greater than Z0 and is smaller than ZM. The outer surface 185a is an example of a first surface, and the second step surface 185c is an example of a second surface. The right side surface 121 is an example of the first side surface at X0, the top side surface 122 is an example of the second side surface at YM, the left side surface 123 is an example of the third side surface at XM, and the bottom side surface 124 is an example of the fourth side surface at Y0.

<Effect>

According to the present disclosure, the information display device 100 can replace the battery without changing the attitude of the information display device, for example, in a state where it is installed in a wall or on a desk. The information display device according to the embodiment includes an information display part that displays information on a screen parallel to a XY plane at Z0 when the information display device is disposed in a range of X0 to XM, Y0 to YM, and Z0 to ZM of virtual three-dimensional coordinates made of XYZ axes mutually perpendicular, a battery that supplies power to the information display part, a device housing having the first side at XO attached with the information display part, a second side at YM, a third side at XM, and a fourth side at Y0, wherein the device housing includes a battery insertion portion that can attach and detach in a Y axis direction from the fourth side. In the information display device, the battery includes a battery housing having a first surface at ZM parallel to the XY plane, the Z axis component being parallel to the XY plane and a second surface at a position where the Z axis component is larger than Z0 and smaller than ZM, wherein the first surface of the battery housing is exposed from a plane parallel to the XY plane at ZM of the device housing.

In the information display device, the battery insertion portion includes a wall portion that prevents the battery from being attached or detached in the Z axis direction. In the information display device, the battery housing includes a projecting portion that extends in the Y axis direction while contacting the wall portion of the battery insertion portion and projecting in the Z axis direction on the second surface. In the information display device, at least one of an operation unit equipped with a power button, a data communication unit equipped with a connector for communicating with an external device, and a power connection unit equipped with a power source connector for supplying power from the external device are provided on the fourth side. It should be noted that the present invention is not limited to the configuration illustrated in the above-described embodiments, such as a combination of the above-described embodiments and other elements.

These points can be modified without departing from the spirit of the present invention, and can be appropriately determined according to the application.

[Effects of the Invention]

In accordance with the present disclosure, the information display device can be provided that allows the battery to be replaced in the installed state.

[Description of Symbols]

100 Information display device
110 Information display part
120 Housing
128 Battery insertion portion
180 Battery
181 Battery handle
185a Outer surface
183 Stage
184 Projecting portion
185 Battery housing
190 Interface portion
200 Housing frame
230 Back plate All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority or inferiority of the invention. Although the information display device has been described in detail, it should be understood that various changes, substitutions, and alterations could be made thereto without departing from the spirit and scope of the invention.

The order of the method of the embodiment of the present invention is not limited to the order of processes of the method disclosed by this disclosure.

The present invention can be implemented in any convenient form, for example using dedicated hardware, or a mixture of dedicated hardware and software. The present invention may be implemented as computer software implemented by one or more networked processing apparatuses. The network can comprise any conventional terrestrial or wireless communications network, such as the Internet. The processing apparatuses can compromise any suitably programmed apparatuses such as a general purpose computer, personal digital assistant, mobile telephone (such as a WAP or 3G-compliant phone) and so on. Since the present invention can be implemented as software, each and every aspect of the present invention thus encompasses computer software implementable on a programmable device.

The computer software can be provided to the programmable device using any storage medium for storing processor readable code such as a floppy disk, hard disk, CD ROM, magnetic tape device or solid state memory device.

The hardware platform includes any desired kind of hardware resources including, for example, a central processing unit (CPU), a random access memory (RAM), and a hard disk drive (HDD). The CPU may be implemented by any desired kind of any desired number of processor. The RAM may be implemented by any desired kind of volatile or non-volatile memory. The HDD may be implemented by any desired kind of non-volatile memory capable of storing a large amount of data. The hardware resources may additionally include an input device, an output device, or a network device, depending on the type of the apparatus. Alternatively, the HDD may be provided outside of the apparatus as long as the HDD is accessible. In this example, the CPU, such as a cache memory of the CPU, and the RAM may function as a physical memory or a primary memory of the apparatus, while the HDD may function as a secondary memory of the apparatus.

What is claimed is:

1. An information display device comprising: an information display part which displays information on a screen; a battery for supplying power to the information display part; and a device housing having a plurality of sides surrounding the screen, wherein
the information display part is attached to the device housing, the device housing includes a battery insertion portion, in which the battery is attached and detached in a direction along the screen at one side of the plurality of sides, the battery insertion portion including an outer wall portion that is disposed towards a back exterior surface of the device housing,
the battery has a battery housing formed of a first surface and a second surface, the second surface (i) being parallel to the first surface, (ii) extending along sides of the battery housing in the direction along the screen, and (iii) being disposed at a height different from the first surface, and
a projecting portion is formed on the second surface, the projecting portion contacting the outer wall portion of the battery insertion portion upon insertion of the battery into the battery insertion portion and extending over at least a portion of the length of the second surface in the direction along the screen.

2. The information display device according to claim 1, wherein,
when the information display device is disposed in a virtual three-dimensional coordinate space formed by XYZ axes mutually perpendicular,
the screen is parallel to an XY plane, and
the battery is attached and detached from the one side in a Y axis direction.

3. The information display device according to claim 2, wherein
the first surface and the second surface are parallel to the XY plane,
the height difference between the first surface and the second surface has a height different in a Z axis direction from the first surface,
a portion of the battery housing where the second surface is formed is disposed nearer to the screen than the first surface of the battery housing, and
the first surface being exposed on the back exterior surface of the device housing when the battery is inserted into the battery insertion portion.

4. The information display device according to claim 1, wherein the side among the plurality of sides on which a battery inlet included in the battery insertion portion is formed includes at least one of an operating portion including a power button, a data communication portion including a connector for communicating with an external device, and a power source connector including a power source connector for externally being supplied with power.

5. The information display device according to claim 1, wherein
a cross section of the projecting portion in a direction orthogonal to the direction along the screen, in which the projecting portion extends, is semi-circular.

* * * * *